(12) United States Patent
Sano et al.

(10) Patent No.: US 12,341,056 B2
(45) Date of Patent: Jun. 24, 2025

(54) METHOD OF FABRICATING A SEMICONDUCTOR STRUCTURE AND SEMICONDUCTOR STRUCTURE OBTAINED THEREFROM

(71) Applicant: TAIWAN SEMICONDUCTOR MANUFACTURING COMPANY LTD., Hsinchu (TW)

(72) Inventors: Kenichi Sano, Hsinchu (TW); Chung-Liang Cheng, Changhua County (TW); De-Yang Chiou, Hsinchu (TW); Kuanliang Liu, Pingtung County (TW); Pinyen Lin, Rochester, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 652 days.

(21) Appl. No.: 17/461,798

(22) Filed: Aug. 30, 2021

(65) Prior Publication Data

US 2023/0066183 A1    Mar. 2, 2023

(51) Int. Cl.
*H01L 21/762* (2006.01)
*H01L 21/67* (2006.01)
*H01L 21/768* (2006.01)

(52) U.S. Cl.
CPC .... *H01L 21/76251* (2013.01); *H01L 21/6708* (2013.01); *H01L 21/76814* (2013.01)

(58) Field of Classification Search
CPC ........... H01L 21/76251; H01L 21/6708; H01L 21/76814

USPC ......................................................... 438/401
See application file for complete search history.

(56) References Cited

U.S. PATENT DOCUMENTS

| | | | |
|---|---|---|---|
| 5,268,065 A * | 12/1993 | Grupen-Shemansky | H01L 21/6835 156/154 |
| 11,004,755 B2 * | 5/2021 | Taddei | H01L 21/67075 |
| 2007/0161199 A1 * | 7/2007 | Morita | H01L 21/26506 438/149 |
| 2007/0224821 A1 * | 9/2007 | Koyata | H01L 21/30604 438/691 |
| 2009/0004876 A1 * | 1/2009 | Koyata | H01L 21/30604 257/E21.214 |
| 2013/0328174 A1 * | 12/2013 | La Tulipe, Jr. | H01L 25/50 257/629 |
| 2015/0347659 A1 * | 12/2015 | Chiang | H01L 27/092 716/55 |
| 2017/0194194 A1 * | 7/2017 | Tsai | H01L 25/50 |
| 2020/0243352 A1 * | 7/2020 | Wu | H01L 22/12 |
| 2022/0028833 A1 * | 1/2022 | Okubo | H01L 25/0657 |

* cited by examiner

*Primary Examiner* — Kimberly N Rizkallah
*Assistant Examiner* — Nicholas B Michaud
(74) *Attorney, Agent, or Firm* — WPAT LAW; Anthony King

(57) ABSTRACT

A method of fabricating a semiconductor structure and the semiconductor structure are disclosed. The method uses high flow rate of an etchant and an optimized scan pattern, so that the obtained semiconductor structure is a device upside-down bonded to the carrier wafer without any silicon remaining and is ready for subsequent lithography process for back via contact.

20 Claims, 11 Drawing Sheets

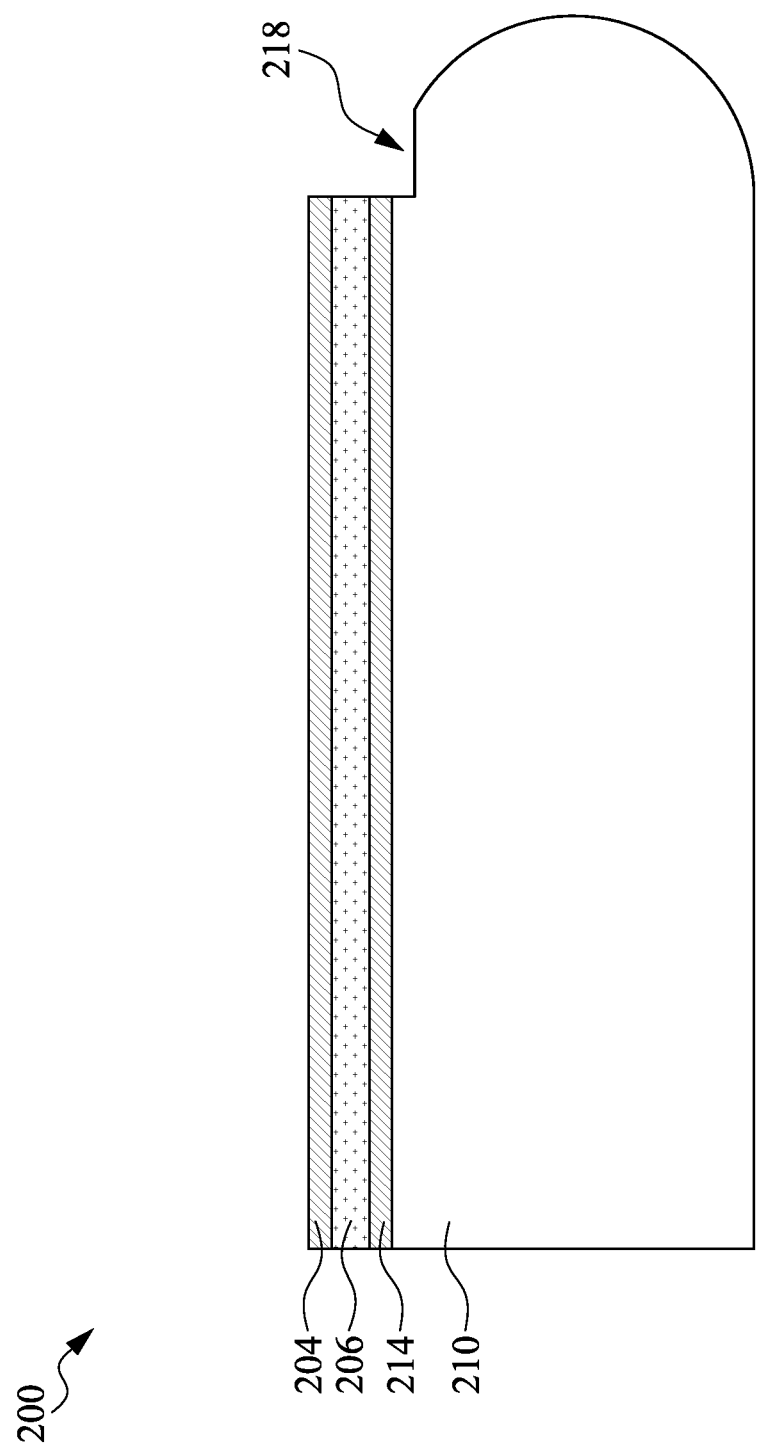

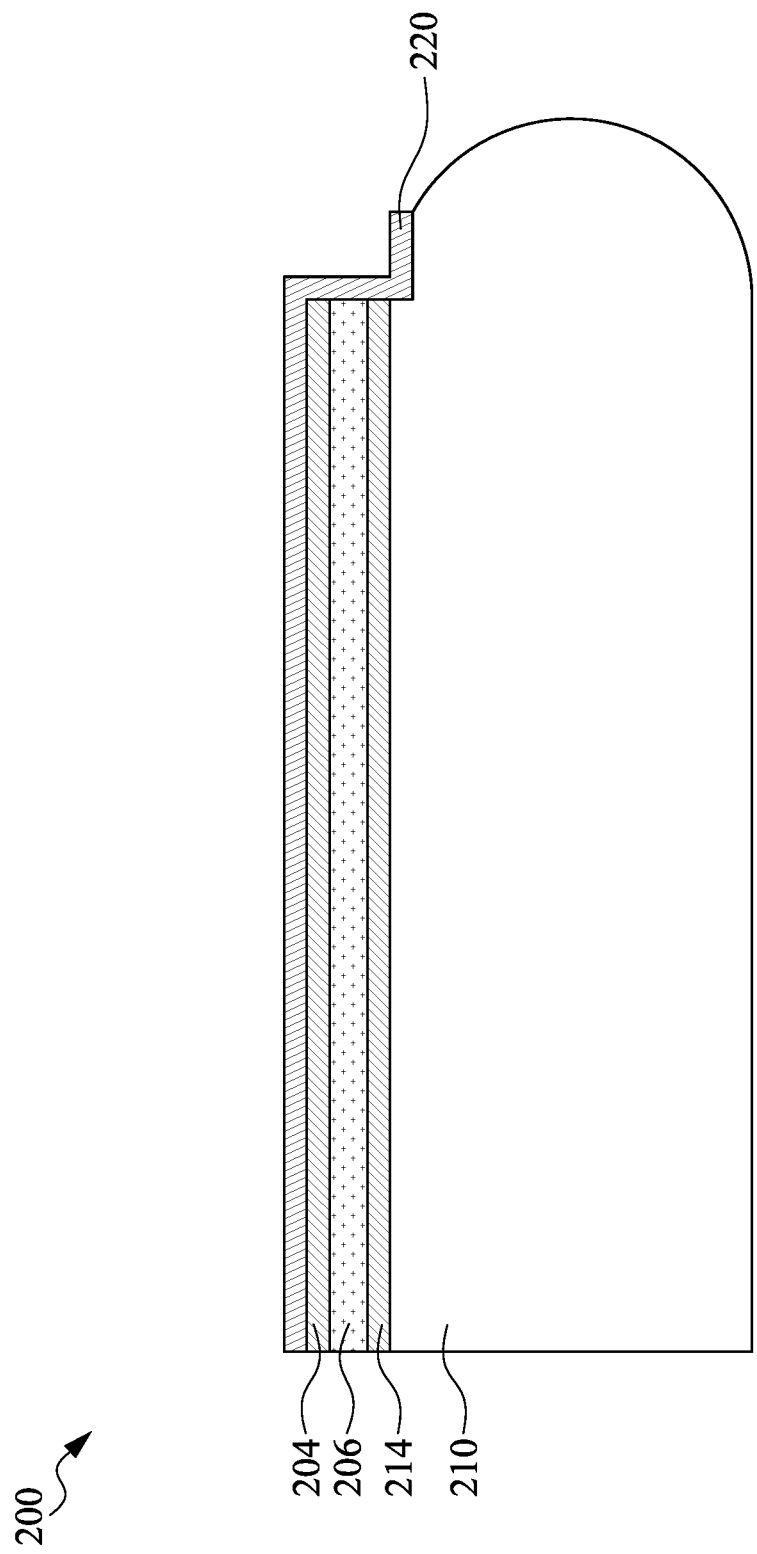

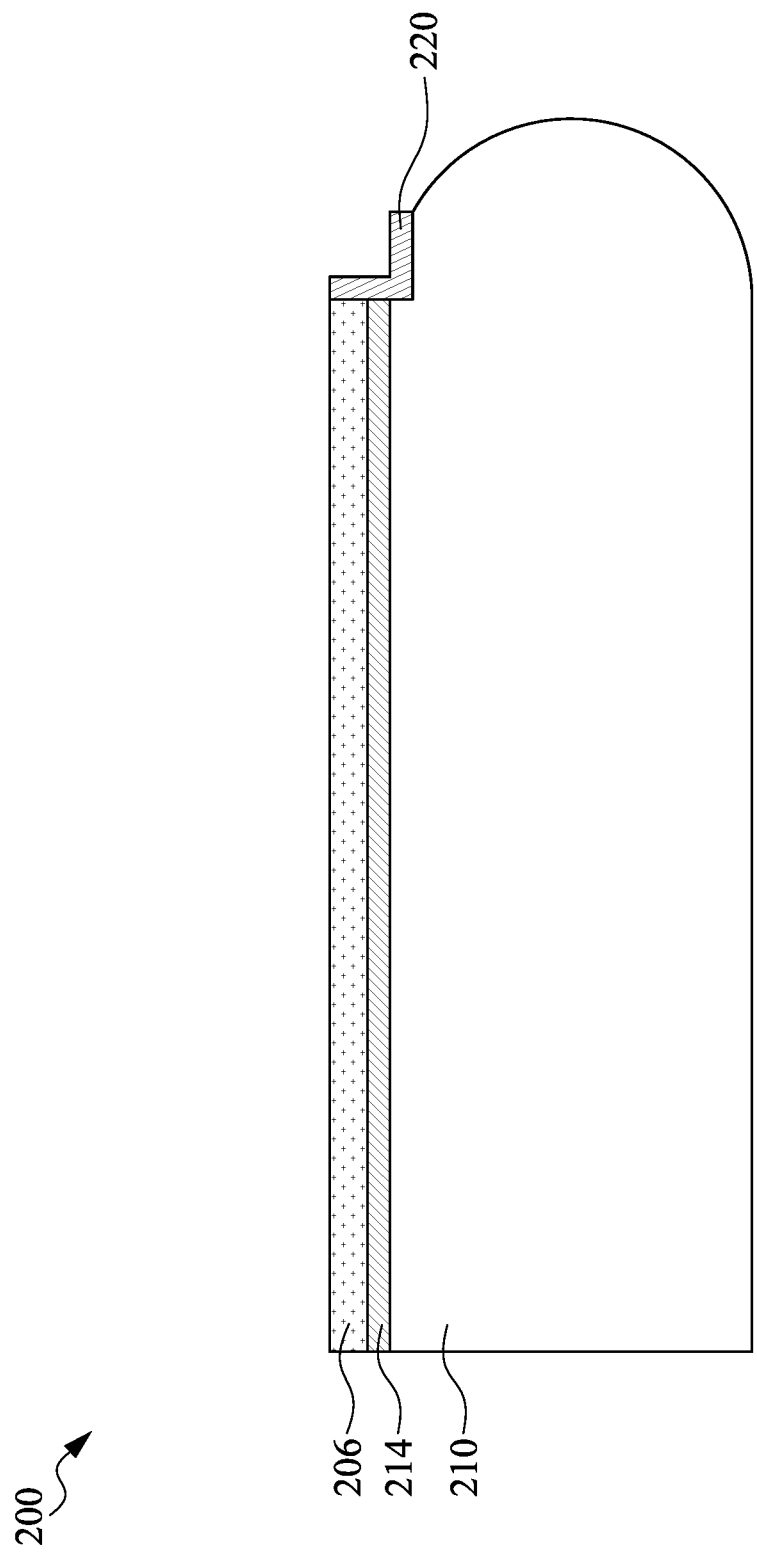

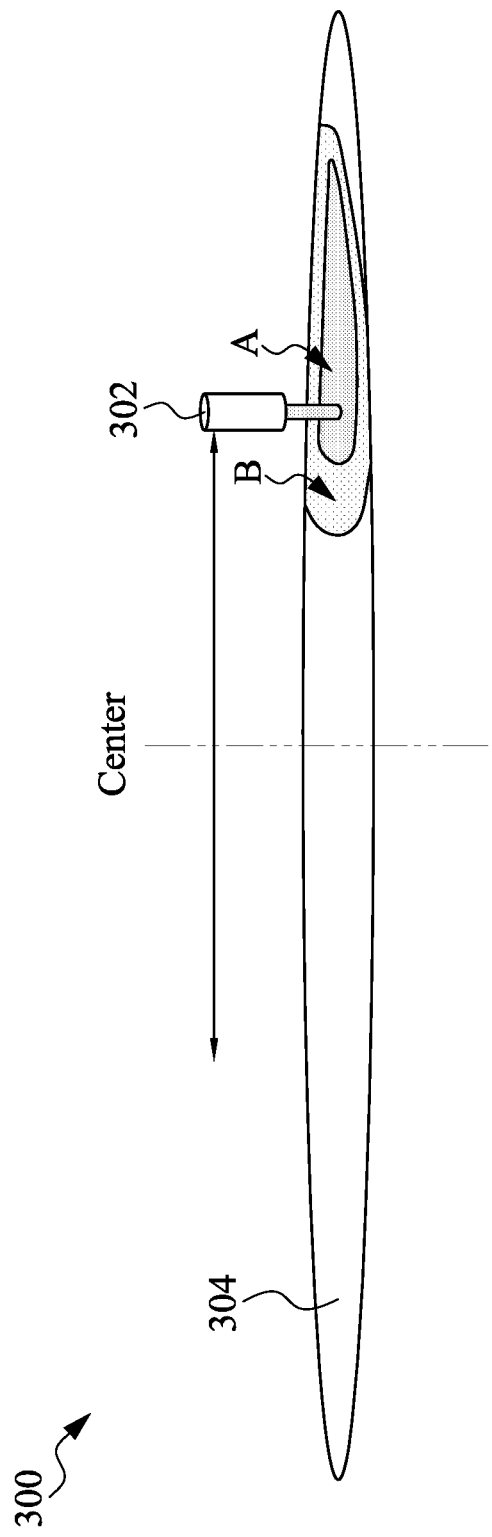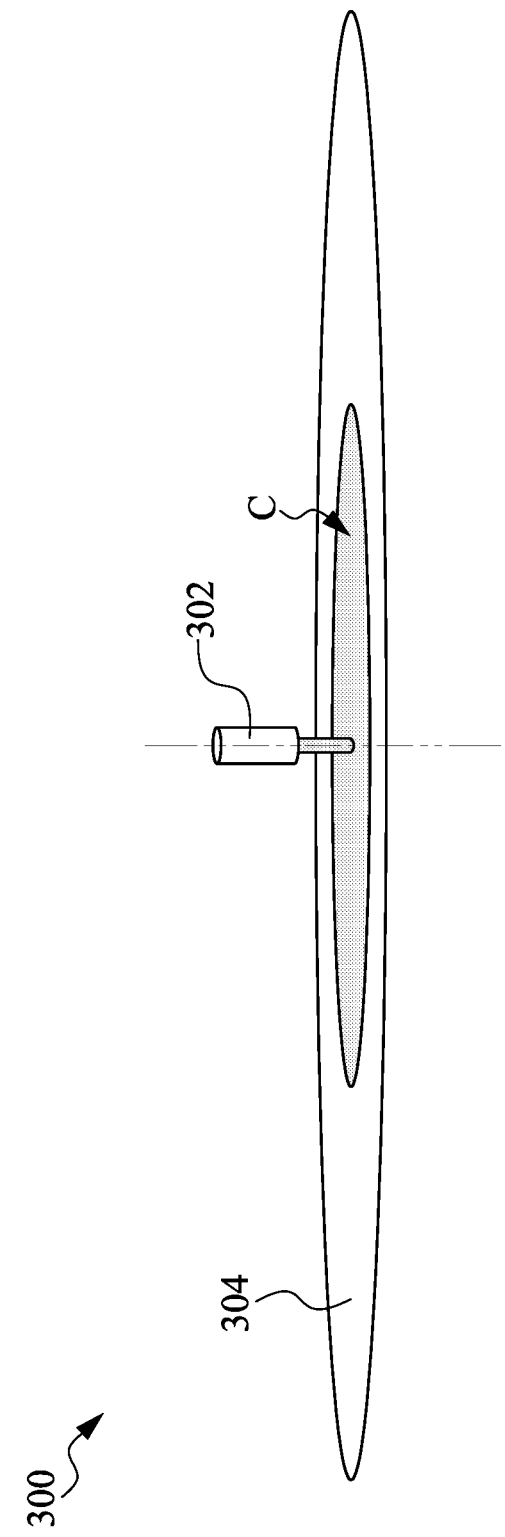

METHOD OF FABRICATING A SEMICONDUCTOR STRUCTURE AND SEMICONDUCTOR STRUCTURE OBTAINED THEREFROM

BACKGROUND

The semiconductor integrated circuit (IC) industry has experienced exponential growth in recent year. Wafer-to-wafer 3D integration has a potential to minimize the silicon thickness, which enables to connect multiple wafers with significantly scaled through-Si vias. In order to achieve this type of 3D structure, backside thinning is a key step. Conventional mechanical grinding is known as the best way to remove bulk Si in terms of cost of ownership. However, mechanical damage such as induced dislocations needs to be removed after extreme thinning to avoid a serious impact on the device performance. Chemical mechanical polishing (CMP) shows the best performance in terms of roughness with a significantly flat surface with only atomic step roughness. Dry etch process enables a faster etch rate than CMP and wet etching, and to achieve extreme thinning of active device wafers. However, the total thickness variation (TTV) worsens as more silicon is removed. There are challenges in fabricating an advanced IC involving thinning a wafer.

BRIEF DESCRIPTION OF THE DRAWINGS

Aspects of the present disclosure are best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIGS. 2A-2H are cross-sectional views of a sequential process of fabricating a semiconductor structure during various manufacturing stages according to the method of FIG. 1 in accordance with some embodiments of the present disclosure.

FIGS. 3 and 4 are schematic diagrams illustrating a wet etching method in accordance with some embodiments of the present disclosure.

DETAILED DESCRIPTION OF THE DISCLOSURE

Figure 1:
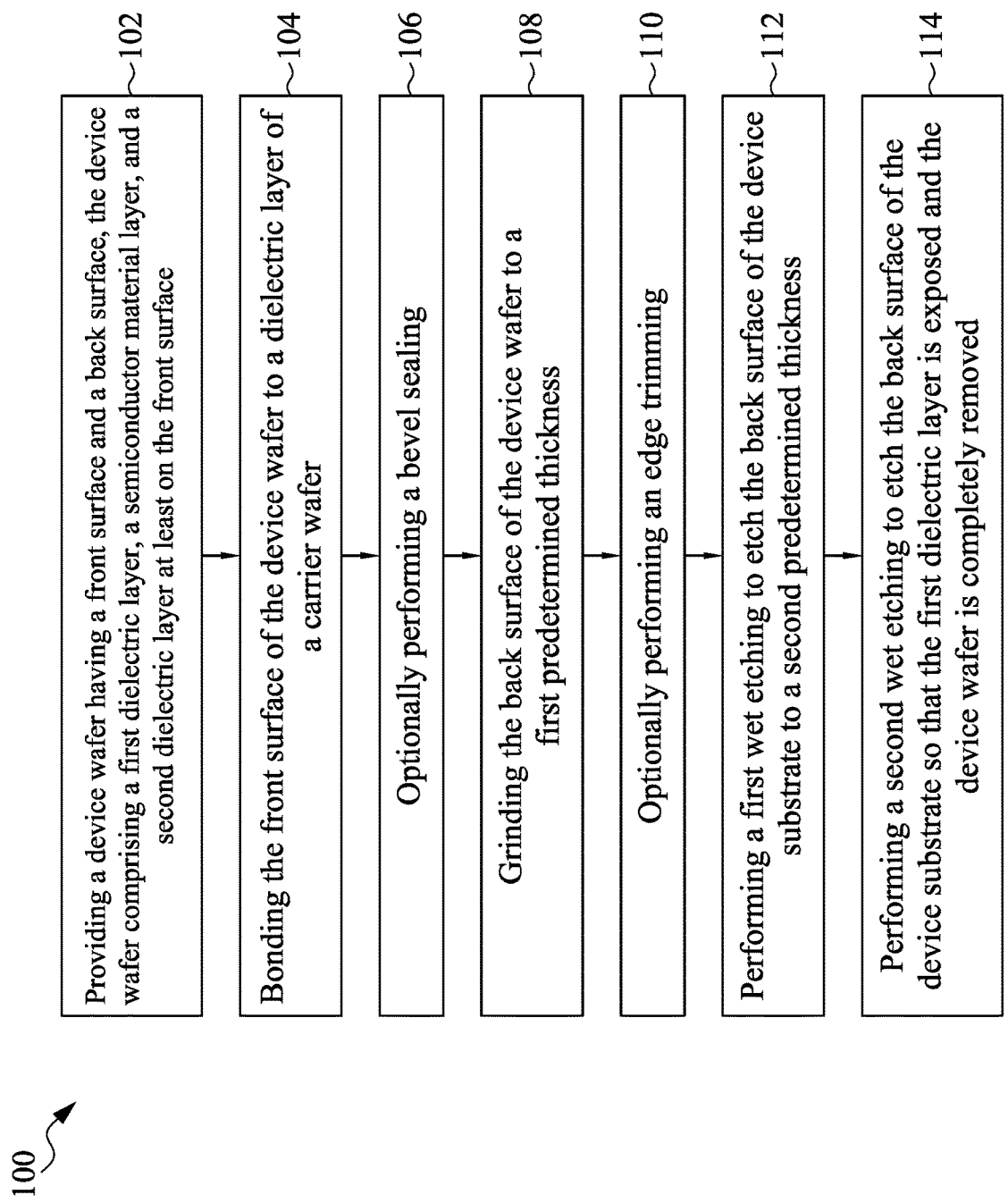
FIG. 1 is a flow chart illustrating a method 100 of fabricating a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure is directed to a method of fabricating a semiconductor structure and the semiconductor structure obtained therefrom. The present disclosure also relates to a method for thinning a wafer or thick silicon.

Semiconductor processing for the fabrication of integrated circuit (IC) chips continues to evolve towards increasing device density, and higher numbers of active devices (mainly transistors) of ever decreasing device dimensions are placed on a given surface of semiconductor material. All signal and power interconnect are done through back end of line (BEOL) processing on the front side of the wafer. The integration of this power delivery network (PDN) in the back end of line has become particularly challenging because of the abovementioned increase in the device density. A backside power delivery network has been introduced. This would require thinning of wafers to expose nanometer-scale through silicon vias. Moving BEOL power distribution to the silicon backside allows direct delivery to the standard cells, would enhance system performance, increase chip area utilization, and reduce BEOL complexity.

In semiconductor technologies, image sensors are used for sensing a volume of exposed light projected towards a semiconductor substrate. Complementary metal-oxidesemiconductor (CMOS) image sensors (CIS) and charge-coupled device (CCD) sensors are widely used in various applications such as digital still camera applications. These devices utilize an array of pixels or image sensor elements, including photodiodes and transistors, to collect photo energy to convert images into electrical signals. To enhance the photo-sensing efficiency of the pixels, a back-side illumination (BSI) technique may be used to fabricate the image sensors. The BSI technique utilizes a technique known as wafer bonding, which involves bonding a device wafer to a carrier wafer and thinning the device wafer. The wafer bonding and thinning technique has also been used to produce other types of semiconductor devices such as three-dimensional structure IC.

There are several methods that are presently being used for thinning wafers, the most popular being the well-established mechanical back grinding and polishing technique. Typically, the thinning process is performed on the backside of the wafer by mechanical grinding to remove the bulk of the wafer and then a multistep sequence of processes that includes chemical mechanical polishing (CMP), dry etching, and wet etching to complete the final thinning of the wafer. In some comparative embodiments, the thinning process may comprise performing a dry etch such as plasma etching and reactive ion etching (RIE) that provides high silicon etch rate but worse total thickness variation (TTV); performing a wet etching to break though oxide by using hydrogen fluoride; performing a wet etching by using tetramethyl ammonium hydroxide (TMAH) to compensate the worse TTV value caused by the dry etching; performing a CMP process to reduce the thickness of the silicon wafer to about 1 μm; and performing another wet etching by using TMAH to remove the residual materials of the silicon wafer.

However, the process has several disadvantages associated therewith including but not limited to the complexity of the process and the associated costs. As described hereinafter, the present invention is directed at overcoming these deficiencies associated with the complex and costly process by providing a simple, cost effective method to remove the remaining wafer to a desired thickness and has good surface uniformity.

In some embodiments of the present disclosure, a method for fabricating a semiconductor structure is provided. The present disclosure also relates to a method for thinning a wafer or thick silicon. FIG. 1 is a flow chart illustrating a method 100 of fabricating a semiconductor structure in accordance with some embodiments of the present disclosure. The method 100 begins with operation 102 in which a device wafer is provided. The device wafer has a front surface and a back surface, and comprises a first dielectric layer, a semiconductor material layer, and a second dielectric layer at least on the front surface. The method 100 proceeds with operation 104 in which a carrier wafer is provided, and then the front surface of the device wafer is bonded to a dielectric layer of the carrier wafer. The method 100 proceeds with operation 106 in which a bevel sealing process can be optionally performed. The method 100 then proceeds with operation 108 in which the back surface of the device wafer is mechanically grinded to a first predetermined thickness. Thereafter, the method 100 proceeds with operation 110 in which an optional edge trimming process may be performed. The method 100 then proceeds with operation 110 in which a first wet etching is performed to etch the back surface of the device substrate to a second predetermined thickness. Further, the method 100 proceeds with operation 112 in which a second wet etching is performed to etch the back surface of the device substrate so that the first dielectric layer is exposed and the device wafer is completely removed. In some embodiments, the device wafer is thinned but not completely removed.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

FIGS. 2A-2H are cross-sectional views of a method of fabricating a semiconductor structure 200 during various manufacturing stages according to the method of FIG. 1 in accordance with some embodiments of the present disclosure. In some embodiments, the semiconductor structure 200 to be formed illustrates an integrated circuit or a portion thereof that can comprise memory cells and/or logic circuits. The semiconductor structure 200e can include back-side illumination (BSI), complementary metal-oxide-semiconductor (CMOS) image sensors (CIS), charge-coupled device (CCD) sensors, buried power rail (BPR), super power rail (SPR), other suitable components, and/or combinations thereof. In some embodiments, the method can be used in technology node: N65 (65-nm node). N28 (28-nm node) or N7 (7-nm node) or beyond, but is not limited thereto. It is understood that additional steps can be provided before, during, and after the methods, and some of the steps described below can be replaced or eliminated, for additional embodiments of the methods. It is further understood that additional features can be added in the semiconductor structure, and some of the features described below can be replaced or eliminated, for additional embodiments of the semiconductor device.

Figure 2A:
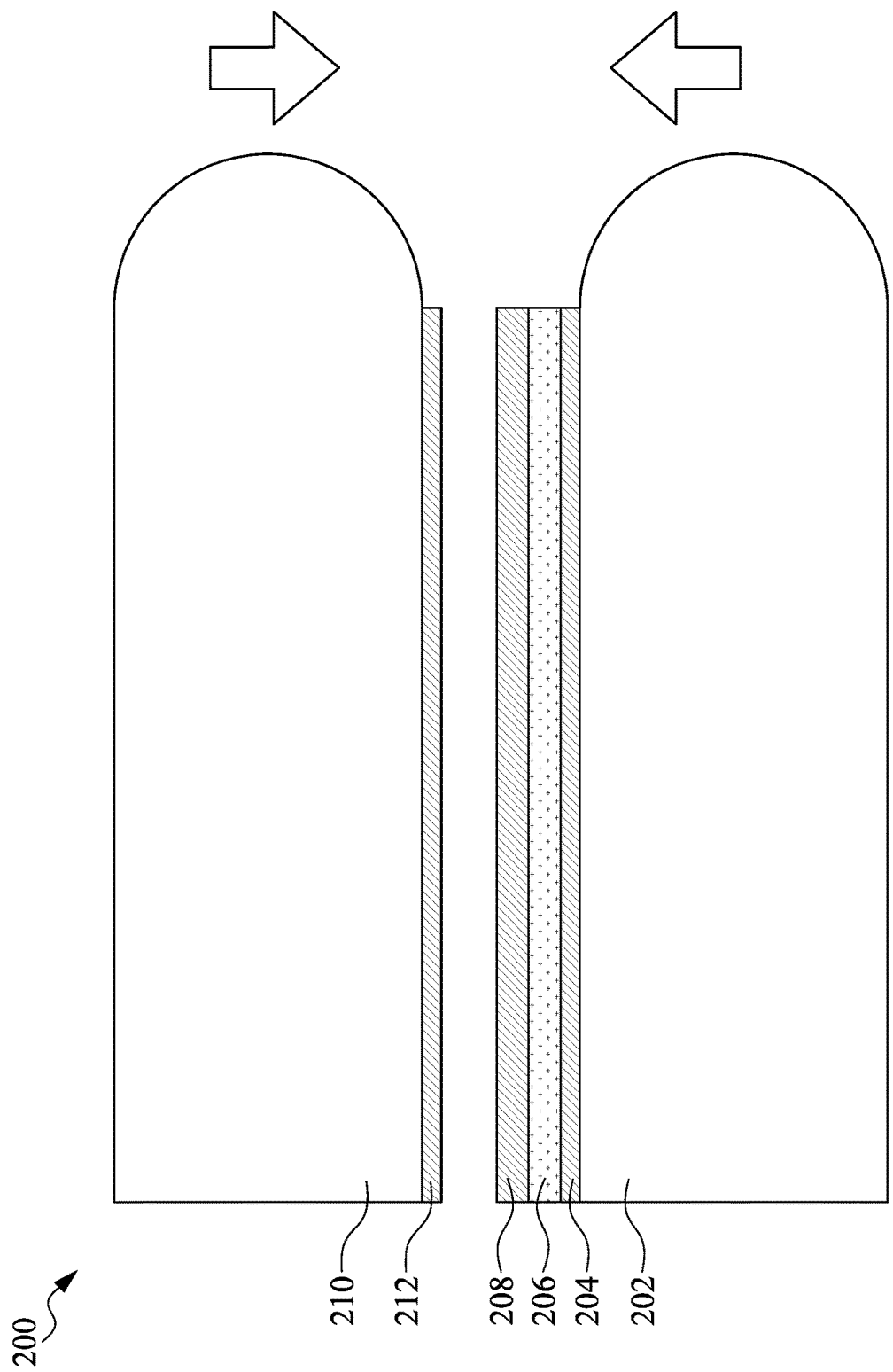

As shown in FIG. 2A, a device wafer 202 is provided. The device wafer 202 has a front surface and a back surface. The device wafer 202 further comprises a first dielectric layer 204, a semiconductor material layer 206, and a second dielectric layer 208 at least on the front surface. The suitable device wafer 202 may comprise, but are not limited to, silicon, thick SOI, thin SOI, silicon substrate layer with an SiGeC etch stop layer, GaAs. GaAs substrate with an etch stop layer, InP, In As, InGaAs, InSb, GaSb, ZnO, sapphire, and any other material on which electronic structures may be fabricated.

The front surface of the device wafer 202 may comprise features (not shown in FIG. 1) such as microelectronic or microwave material layers, devices, or circuits, optoelectronic layers, light emitting diodes, lasers, and combinations thereof. As used herein, the term "features" includes, but is not limited to, device structures, active regions, material layers, circuits, and any other components or materials that may be fabricated on a wafer. The features may be fabricated as part of the method, or they may be preexisting on the wafer. At this point in the method, all desired features may already be fabricated, the features may be only partially complete, or no features may be present. The device wafer 202 may include several features in the semiconductor material layer 206, such as a transistor and a metal pad, formed on or in its front surface. The device wafer 202 may include a front end of line (FEOL) portion of the first dielectric layer 204, a middle end of line (MEOL) portion of the front end of line portion, and/or a back end of line (BEOL) portion on the middle end of line portion.

In some embodiments, FEOL is the first portion of a semiconductor fabrication process (e.g., an IC fabrication process) whereby individual active devices are patterned on a semiconductor wafer, for example. FEOL processes include, in some embodiments, selecting the type of semiconductor wafer to be used, chemical-mechanical planarization and cleaning of the wafer, shallow trench isolation (STI), well formation, gate module formation, and source and drain creation, among others. FEOL processes do not include the deposition of metal interconnect layers, in some embodiments. MEOL processes occur after FEOL processes and include gate contact formation and under bump metallization (UBM) processes, among others, in some embodiments. BEOL is the final portion of the semiconductor fabrication process, whereby individual devices (e.g., transistors, capacitors, resistors, etc.) are interconnected with vias and conductive traces, for example. The BEOL portion includes conductive interconnects as is known in the art. The FEOL portion may comprise a processed semiconductor substrate, provided with a plurality of transistors and other devices, obtained by or obtainable by processing (e.g. shallow trench isolation. N+/P+ implants, gate deposition) a semiconductor wafer. The BEOL portion may comprise a sequence of metallization layers for establishing electrical signal paths between the different parts of the FEOL portion and external terminals to which a semiconductor device is connected.

Referring to FIG. 2A, the material of the first dielectric layer 204 may include, but is not limited to, an inorganic dielectric material such as silicon oxide, silicon nitride or silicon oxynitride, organic dielectric material or a combination thereof. In some embodiments, the first dielectric layer 204 has a thickness of about 100 Å to about 300 Å, about 150 Å to about 250 Å, or about 200 Å to about 280 Å, but is not limited to the above-mentioned values.

The first dielectric layer 204 may be used as an etch stop layer. The device wafer 202 may comprise one or more etch stop layers. Typical etch stop layers for silicon substrate technology include, but are not limited to, silicon oxide layer, SiGe layer, SiGeC layer, carbon layer, silicon nitride layer, heavily boron doped layer, boron doped SiGe or SiGeC layer, and PN junction for galvanic etch stop or electrochemical etch stop. Typical etch stop layers for GaAs technology include AlGaAs and InGaP. The etch stop layer can be implemented either close to the front surface so that there is thin amount of wafer material near the front surface. An example is thin SOI, which may have a silicon device layer thickness in the range of about 2 nm to about 50 nm. The etch stop layer may also be deeper so that there is a larger amount of wafer material near the front surface. An example is thick SOI, which may have a silicon layer thickness in the range of about 500 nm to about 40 μm. The thick SOI approach allows for a CMP polish on the thick silicon material that can remove several microns of silicon during the CMP polishing operation.

The second dielectric layer 208 may be high density plasma (HDP) oxide, thermally grown oxide or may be deposited by chemical vapor deposition (CVD), plasma enhanced chemical vapor deposition (PECVD), physical vapor deposition (PVD) over the active device wafer 202 on the front side. In some embodiments, the second dielectric layer 208 has a thickness of about 1,000 Å to about 20,000 Å, about 3,000 Å to about 10,000 Å, or about 5,000 Å to about 8,000 Å, but is not limited to the above values. The second dielectric layer 208 is to be used in a subsequent oxide-to-oxide wafer bonding process, as described below, when a carrier wafer 210 may be molecularly bonded to the second dielectric layer 208 on a surface of the active device wafer 202. The second dielectric layer 208 has an exposed surface that is relatively flat and smooth and which is compatible with wafer bonding techniques.

Referring to FIG. 2A, a carrier wafer 210 is provided. The carrier wafer 210 may be a silicon wafer but may be a glass or other material wafer. The carrier wafer 210 may be a plate having a shape (e.g., circular) similar to the device wafer 202 it is supporting. Preferably, the carrier wafer 210 has certain physical properties. For example, the carrier wafer 210 can be relatively rigid for providing structural support for the device wafer 202. The carrier wafer 210 may be resistant to several chemicals and environments associated with various wafer processes. The carrier wafer 210 may have certain desirable optical properties to facilitate several processes (e.g., transparency to accommodate optical alignment and inspections). Materials having some or all of the foregoing properties can include sapphire, borosilicate, quartz, and glass. The carrier wafer 210 may be dimensioned to be larger than the device wafer 202. Thus, for circular wafers, the carrier wafer 210 can also have a circular shape with a diameter that is greater than the diameter of the device wafer 202 it supports. Such a larger dimension of the carrier wafer 210 can facilitate easier handling of the mounted wafer, and thus can allow more efficient processing of areas at or near the periphery of the device wafer 202.

In some embodiments, the thickness of the carrier wafer 210 may range from about 400 μm to about 800 μm. In some embodiments, the carrier wafer 210 may have a thickness of about 750 μm. In some embodiments, the carrier wafer 210 has a third dielectric layer 212 for use as a bonding material layer. The third dielectric layer 212 may be an oxide layer, such as thermally grown oxide or may be deposited by CVD, PECVD, PVD over the carrier wafer 210 on the front side, and may be from about 100 Å to about 1,000 Å thick, about 200 Å to about 600 Å thick, about 350 Å to about 500 Å thick, but is not limited to the above values. The device wafer 202 and the carrier wafer 210 may be bonded together as indicated by arrows shown in FIG. 2A.

Figure 2B:
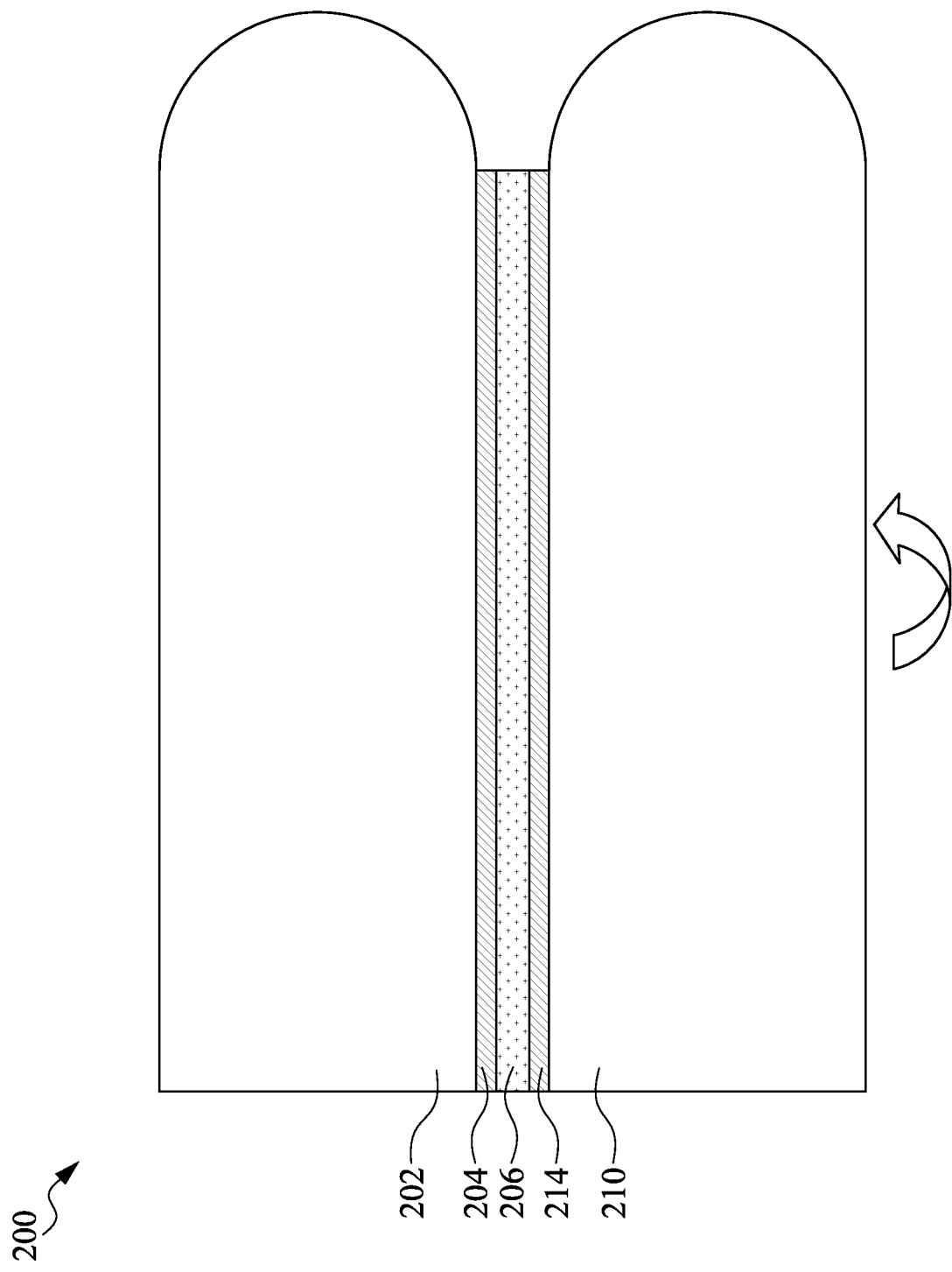

As shown in FIG. 2B, the carrier wafer 210 is bonded to the active device wafer 202. An oxide to oxide wafer bonding process is used to bond the third dielectric layer 212 of the carrier wafer 210 to a second dielectric layer 206 layer formed overlying the front side of the active device wafer 202. In some embodiments, to form the wafer bonding, the surfaces of the dielectric layers 208 and 212 may be activated by a plasma process, or chemically cleaned, for example, and then placed in physical contact. The wafer bonding may take place at ambient temperature or with increased temperature, and may be performed in a vacuum chamber. In some embodiments, a temperature ranging from about 150° C. to about 450° C. may be used during the wafer bonding process. In some embodiments, the bonding step can be performed under suitable operation conditions.

As shown in FIG. 2B, after bonding, the wafers are two-wafer thick. The dielectric layers 208 and 212 are combined as a bond oxide layer 214. The bonded wafers are flipped upside down for the subsequent steps as indicated by an arrow shown in FIG. 2B.

Figure 2C:
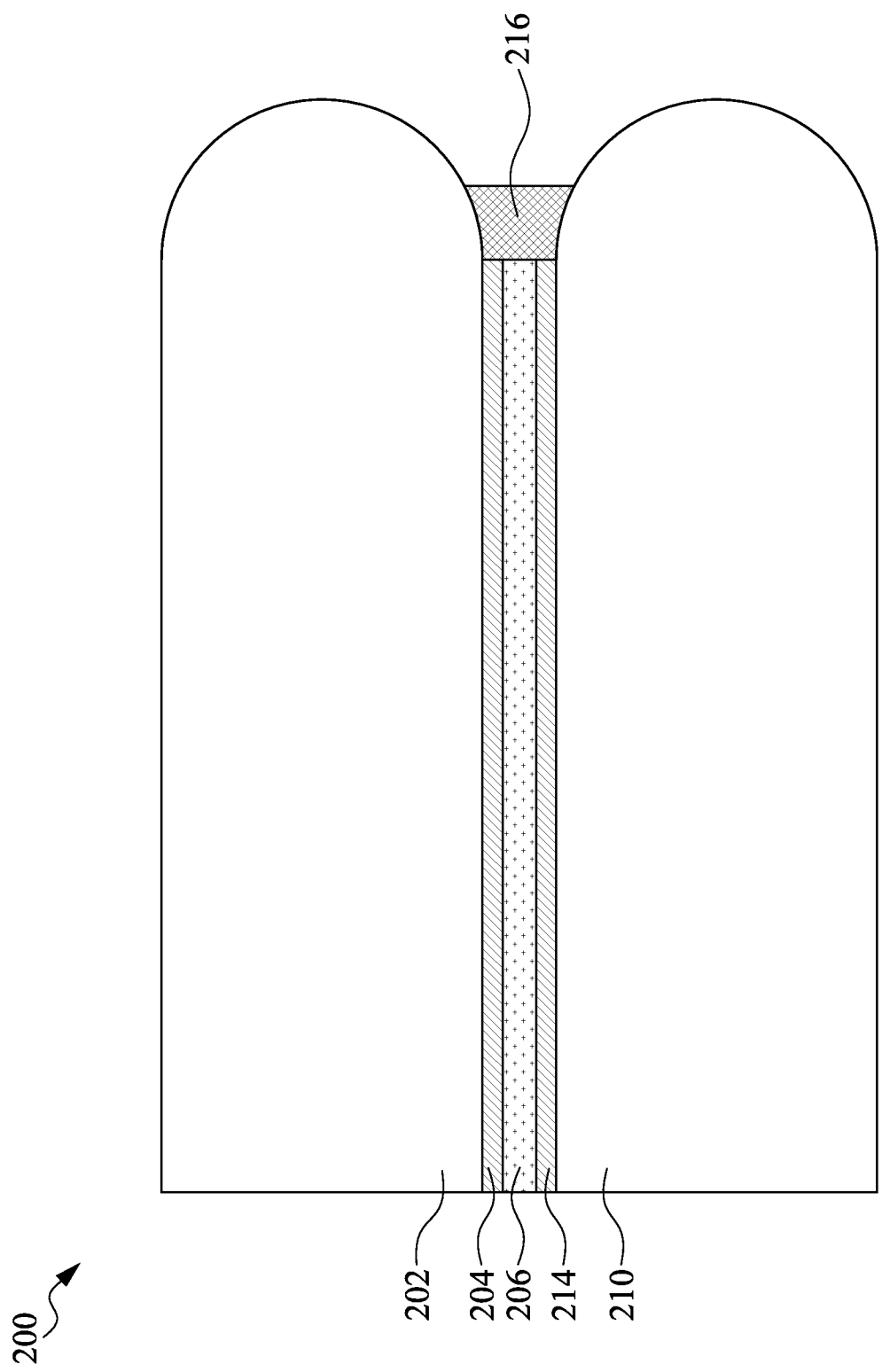

When two wafers are bonded, there can be non-bonded area close to the edge due to wafer bevels. The non-bonded area may induce cracks or peeling during direct back grinding or other processes that apply mechanical stress. As shown in FIG. 2C, prior to the subsequent wafer grinding, a gap 216 between the bonded wafers 202, 210 along an edge can be optionally filled with a protection material. In some embodiments, the gap 216 is filled by spraying a protection material by a jet nozzle. The protection material may comprise epoxy or underfill material. For example, the protection material comprises carbon, silicon, and oxygen in some embodiments. The protection material may comprise carbon, alumina, and oxygen. The bevel sealing step may be performed under suitable operation conditions.

Figure 2D:
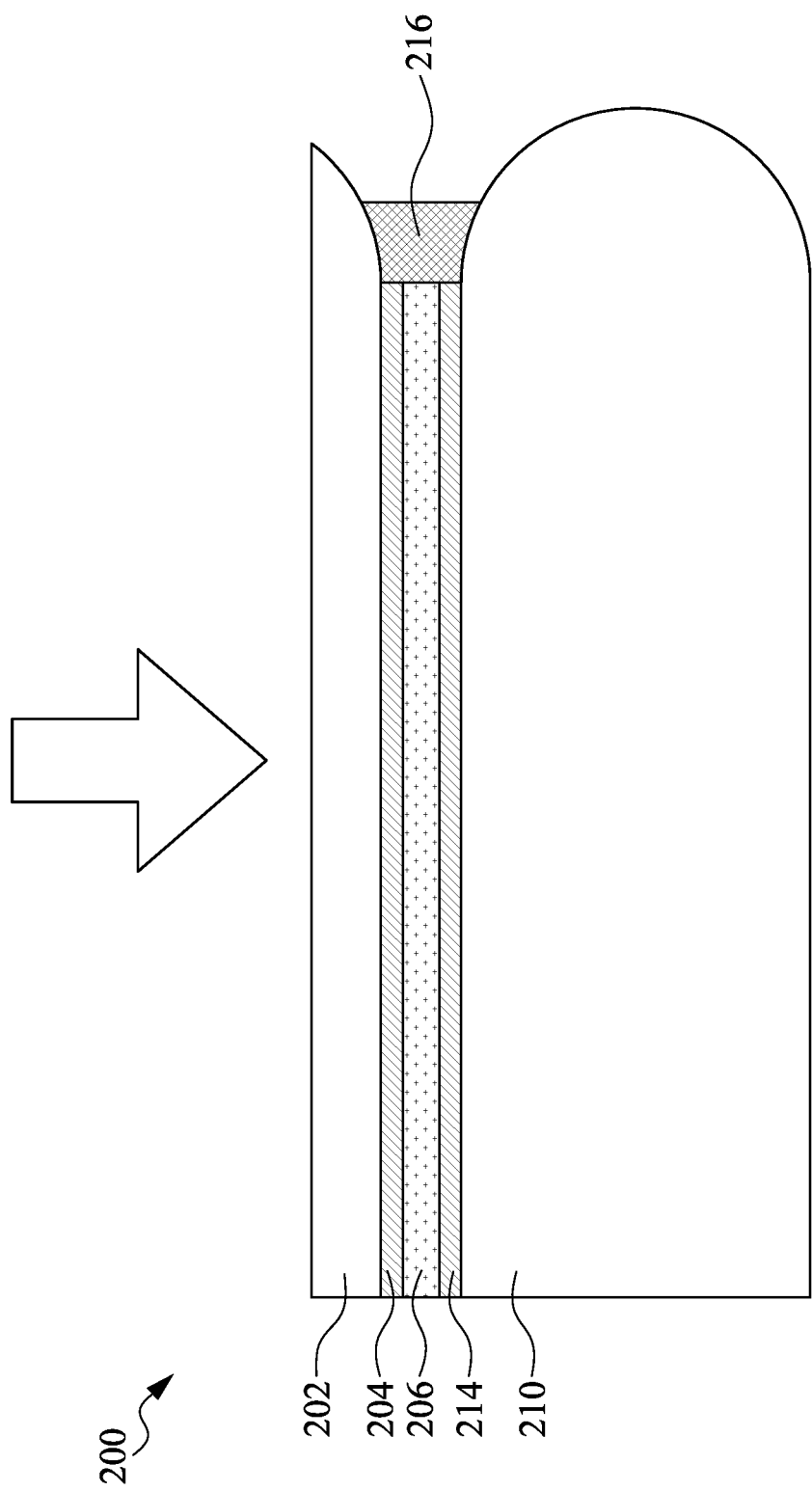

In some embodiments, a wafer grinding or wafer thinning operation as indicated by an arrow shown in FIG. 2D is performed to remove a predetermined thickness of the device wafer 202 from the back side. The thinning the backside of the device wafer 202 may include performing one or more of grinding, etching and chemical mechanical polishing on the backside of the device wafer. The mechanical grinding may be the most common technique for wafer thinning due to its high thinning rate, and can easily thin down the wafer from about 750 µm to about 50 µm, to about 30 µm or to about 20 µm. The back side of the device wafer 202 may be ground away (e.g., via two-step grind with coarse and fine diamond-embedded grinding wheels) to yield an intermediate thickness substrate with a relatively rough surface. In some embodiments, such a grinding process can be performed with the bottom surface of the device wafer 202 facing downward. The device wafer 202 is thinned from the back surface. The method of decreasing the thickness of the device wafer 202 may include arranging a power device and memory on the front surface of the device wafer 202, mechanically polishes the back surface of the device wafer 202 to a predetermined thickness by back mechanical wafer grinding using abrasive polishing grains. During the back-grinding process, the device wafer 202 may be placed on a chuck table (not shown) and a grinding wheel (not shown) grinds off the excess wafer. The device wafer 202 may be grinded to have a first predetermined thickness. In some embodiments, the thickness of the device wafer 202 is reduced to about 15 µm to about 20 µm or to about 17 µm by mechanical wafer grinding. The grinding step may be performed under suitable operation conditions.

Figure 2E:
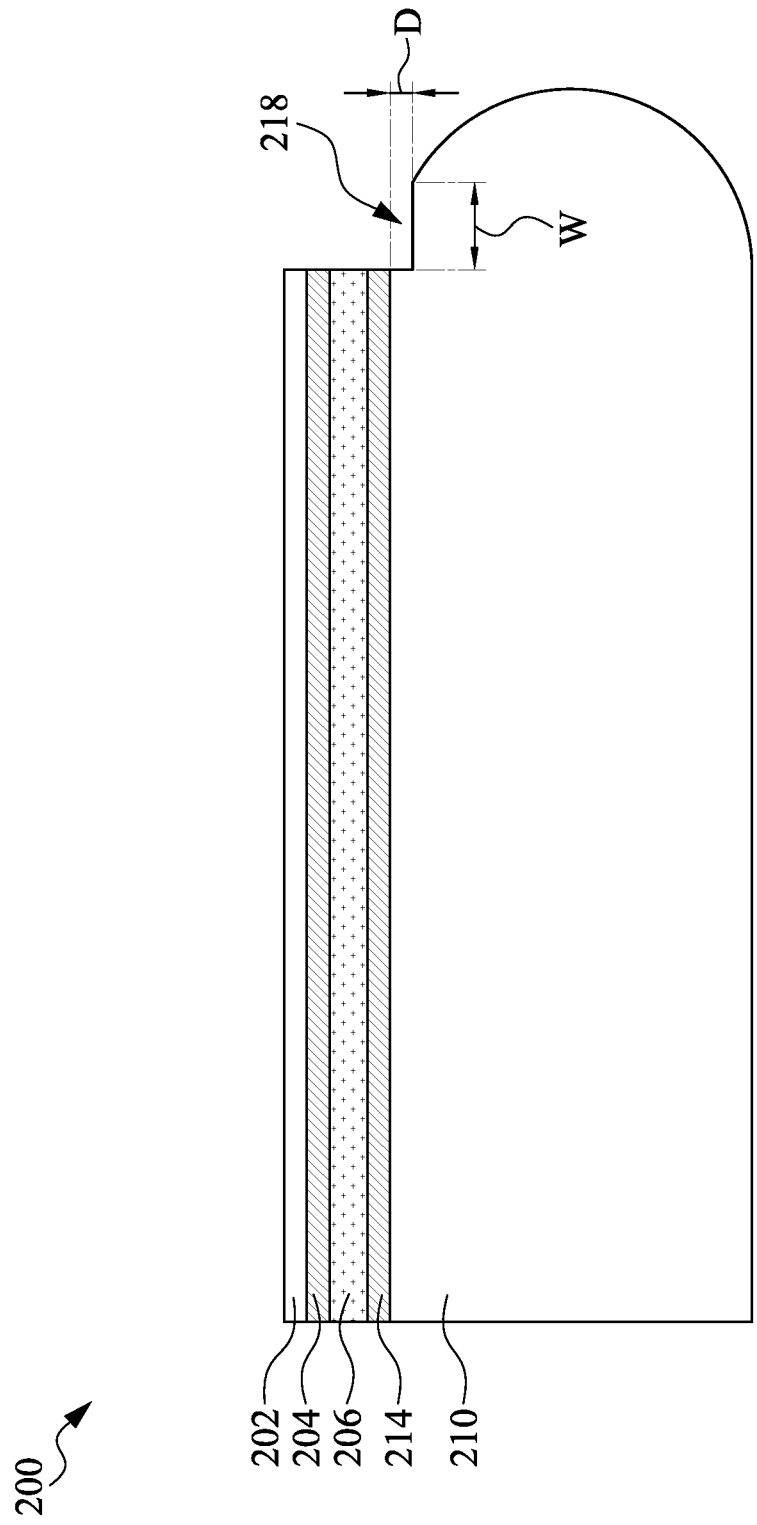

Typically, most wafers may have a bevel edge resulted by a wafer thinning process. When the mechanical stress or thermal stress generated by the fabricating method is imposed to the wafers, the existence of the bevel may cause uneven stress being subjected to the edge of the wafer, thus wafer crack and delamination may be triggered. As shown in FIG. 2E, a wafer edge trimming process is performed to remove the bevel edge portion out. In some embodiments, the wafer edge trimming process may utilize a grinding wheel to polish the bevel edge. The wafer edge trimming may be performed by using a wet treatment process. In some embodiments, a trimming step is performed to trim an edge portion of the wafer. After the edge trimming process, some portions of the edge bevel removal region remain, although some edge portions of edge bevel region are trimmed. A recess 218 formed by the trim process may extend into carrier wafer. The recess 218 in the carrier wafer may have a width (W) of about 1 mm to about 5 mm, about 2 mm to about 3 mm, or about 2.8 mm, and a depth (D) of about 50 µm to about 150 µm or about 80 µm to about 100 µm, but the width and the depth are not limited to the above values. The edge trimming step may be performed under suitable operation conditions.

As shown in FIG. 2F, a wet etching process is performed to backside of the device wafer 202 to further thin the device wafer 202 or completely remove the device wafer 202. In some embodiments, a high selectivity wet etching process using an etching aqueous solution comprising hydrofluoric acid, nitric acid, sulfuric acid, phosphorous acid, tetramethylammonium hydroxide (TMAH), ammonium hydroxide (NH$_4$OH), or mixtures thereof is performed. The back surface of the device wafer 202 may be etched using a first etching aqueous solution to a second predetermined thickness, and then using a second etching aqueous solution so that the device wafer 202 is completed removed or has a third predetermined thickness. In some embodiments, the second predetermined thickness ranges from about 0.1 µm to about 5 µm or less than 1 µm, but is not limited to the above values; the third predetermined thickness ranges from about 0.01 µm to about 3 µm, but is not limited to the above values.

In some embodiments, the first etching aqueous solution comprises hydrofluoric acid, nitric acid, sulfuric acid, phosphorous acid, or mixtures thereof. The first etching aqueous solution may comprise a mixture of hydrofluoric acid, nitric acid, sulfuric acid, and phosphorous acid. In some embodiments, the first etching aqueous solution comprises about 1.5 wt % to about 4.5 wt % of hydrofluoric acid, about 30 wt % to about 50 wt % of nitric acid, about 8 wt % to about 16 wt % of phosphorous acid, and about 5 wt % to about 15 wt % of sulfuric acid in water. In some embodiments, the first etching aqueous solution comprises about 2.8 wt % of hydrofluoric acid, about 41.7 wt % of nitric acid, about 12.8 wt % of phosphorous acid, about 10.5 wt % of sulfuric acid, and about 32.2 wt % of water. In some embodiments, the second etching aqueous solution comprises tetramethylammonium hydroxide (TMAH), ammonium hydroxide (NH$_4$OH), or mixtures thereof. A chemical mechanical planarization (CMP) process may be optionally used to thin the wafer device 202. The device wafer 202 may be completely removed as shown in FIG. 2F. The surface of the dielectric layer 204 does not contain any residual device wafer or silicon. The device wafer 202 may not be completely removed. The method may use a high flow rate of the etchants and an optimized scam pattern to perform the wet etching process.

In some embodiments, the thickness of the device wafer 202 is reduced to about 15 µm to about 20 µm or to about 17 µm by mechanical wafer grinding. The thickness of the device wafer is then reduced to about 0.1 µm to about 5 µm, about 1 µm to about 2 µm, or less than about 1 µm, but is not limited to the above values by using a first wet etchant comprising hydrofluoric acid, nitric acid, sulfuric acid, phosphorous acid, or mixtures thereof. The device wafer 202 is then completely removed by using a second wet etchant comprising tetramethylammonium hydroxide (TMAH), ammonium hydroxide (NH$_4$OH), or mixtures thereof. The device wafer may be only partially removed. The device wafer may be thinned without using a dry etching process and/or CMP process.

FIGS. 3 and 4 are schematic diagrams illustrating a wet etching method in accordance with some embodiments of the present disclosure. In some embodiments, the first wet etching is performed as shown in FIG. 3, and the second wet etching is performed as shown in FIG. 4. The position of the nozzle can be changed and adjusted. In some embodiments, the wet etching process is performed by positioning an etching supplier 300 including a nozzle 302 over the backside of a wafer 304 to provide an etchant. A nozzle 302 for supplying an etchant may supply an etchant almost perpendicularly to the processing surface of the wafer 304. A higher flow rate may be used due to its wide chemistry coverage, thereby reducing etch rate drop at an edge of the central portion and obtaining an etched surface with good uniformity. In some embodiments, the flow rate of the etchant from the nozzle 302 may range from about 2.5 L/min to about 6 L/min, about 3 L/min to about 5 L/min or may be about 4 L/min, but is not limited to the above values. If the flow rate is too high, etching may be insufficient and cannot easy to be controlled. As shown in FIG. 3, a chemistry coverage area A of about 2 L/min is less than a chemistry coverage B of about 4 L/min. A chemistry coverage area C of about 4

L/min is shown in FIG. 4. Table 1 lists the uniformity (%) of using the same etchant comprising hydrofluoric acid, nitric acid, sulfuric acid, and phosphorous acid, but different flow rates. In the condition of using a flow rate of 2 L/min or less, an etching uniformity of about 6% or higher is obtained due to its higher etch rate and exothermic reaction with silicon. In contrast with using a flow rate of 3 L/min or 4 L/min or higher, a good etching uniformity of about 4.4% or about 2% or lower can be obtained.

TABLE 1

| Flow rate (LPM) | Uniformity (%) |
|---|---|
| 2 | 5.6 |
| 3 | 4.4 |
| 4 | 2.0 |

In some embodiments, due to the use of higher flow rate of the etchant, a nozzle for supplying the etchant may be replaced with a nozzle having bigger internal diameter. The etchant amount to be supplied from a nozzle may vary depending on the nozzle position, and may increase toward the peripheral portion. The inner diameter of a nozzle may increase toward the peripheral portion so that liquid spray velocities from the nozzles are almost equal. In some embodiments, the wet etching is performed at room temperature or about 20° C. to about 30° C. or to about 40° C., or the like, and at a rotation speed ranging from about 400 rpm to about 600 rpm or to about 800 rpm or the like.

Figure 5:
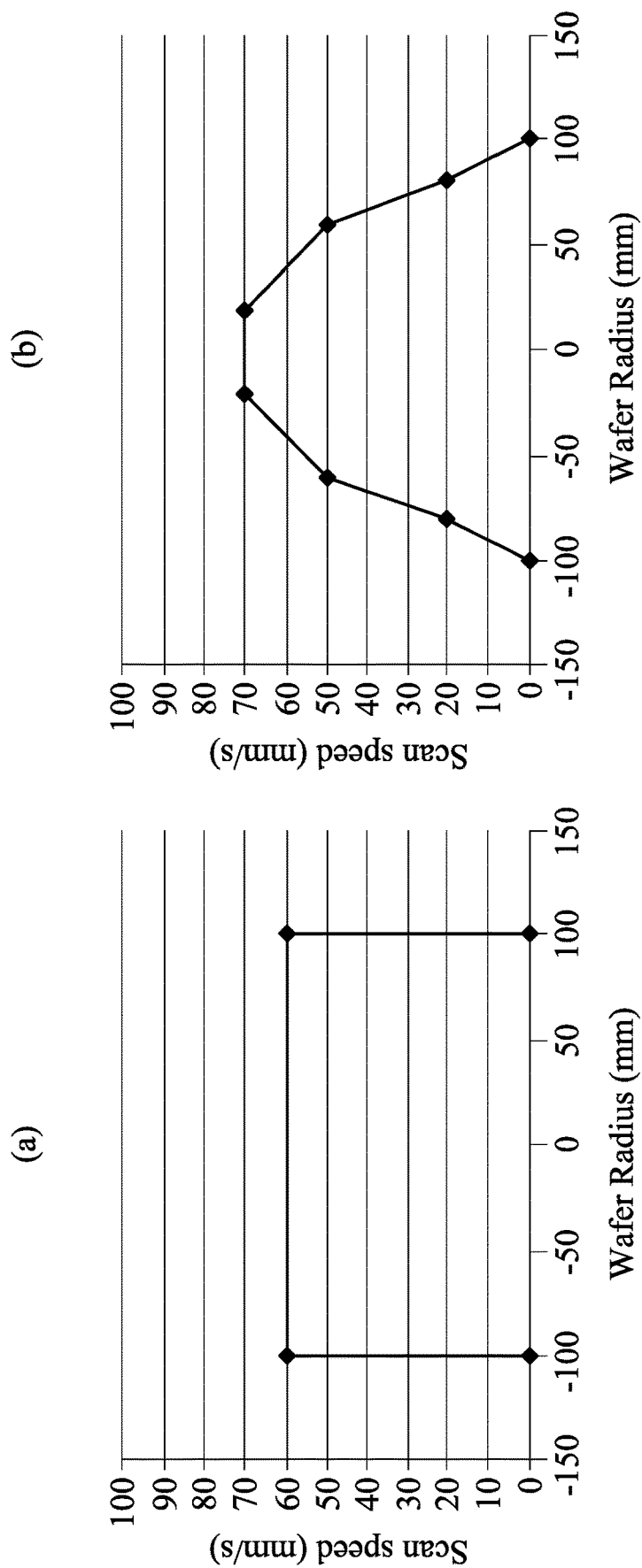
FIG. 5 shows the relationship between the scan speed of a spray nozzle and the wafer radius in a comparative embodiment (a) and in accordance with some embodiments of the present disclosure (b).

In some embodiments, since the first etching aqueous solution has very high etching rate at the injection point of the nozzle, an optimized scan pattern is needed. The wet etching process may be performed with different scan speed of the nozzle at different wafer radius. FIG. 5 shows the relationship between the scan speed of a spray nozzle and the wafer radius in a comparative embodiment (a) and in accordance with some embodiments of the present disclosure (b). As shown in FIG. 5(a), a scanning speed of the spray nozzle of the chemical etching instrument is substantially constant at each position of the device wafer. Accordingly, the uniformity of the etched wafer is not good enough due to a very high etch rate at the central portion of the wafer. As shown in FIG. 5(b), a scanning speed of a spray nozzle of the chemical etching instrument is higher at a central portion of the device wafer than at a peripheral portion of the device wafer. The scanning speed of the spray nozzle of the chemical etching instrument may be substantially constant at the central portion of the device wafer. The scanning speed of the spray nozzle of the chemical etching instrument may gradually decrease from the central portion to the peripheral portion of the device wafer. The scanning speed may gradually decrease with a slope (gradient) as shown in FIG. 5(b). An optimized scan pattern needs higher scan speed (higher than about 4 L/min, such as about 4 L/min) at the central portion and lower scan speed (lower than about 4 L/min, such as about 2 L/min) at the peripheral portion. In some embodiments, the central portion of the wafer represents the region of about 20 mm or about 25 mm from the center of the wafer having a diameter of about 100 mm, and the peripheral portion of the wafer represents the other regions of the wafer. Therefore, the uniformity of the etched wafer can be significantly enhanced.

Referring to FIG. 2G, an oxide cap layer 220 can be deposited over the dielectric layer 204 and the recess 218 and has good adhesion to the underlying dielectric layer 204 and the carrier wafer 210. The oxide cap layer 220 can be an atomic layer deposition (ALD) oxide layer. Then, referring to FIG. 2H, a CMP process is performed to remove a portion of the oxide cap layer 220 and the dielectric layer 204.

The present disclosure is directed to a semiconductor structure (see FIG. 2F), comprising a wafer; a bond oxide layer disposed over the wafer; a semiconductor material layer comprising features disposed over the bond oxide layer, the features comprising a back end of line (BEOL) portion disposed on the first dielectric layer and a middle end of line (MEOL) portion on the back end of line portion; and a dielectric layer disposed over the semiconductor material layer, wherein no residual silicon is present on the dielectric layer.

The present disclosure provides a unique process to thin down the silicon wafer, especially more than 10 μm of thick silicon, such as from about 20 μm to 0 μm, without damage to underneath devices. The final structure includes a device that is upside-down bonded to a carrier wafer without silicon remaining and is ready for subsequent lithography process for back via contact. The present disclosure uses a single wet etching with a high flow rate and an optimized scan pattern to replace the combination use of dry etching and wet etching so that the disadvantages of the dry etching can be avoided. In high flow rate conditions and under an optimized scan pattern, good total thickness variation (TTV) or good etching uniformity can be obtained. The spin process performance can be greatly enhanced.

In some embodiments, a method of fabricating a semiconductor structure comprises the steps of providing a device wafer having a front surface and a back surface, the device wafer comprising a first dielectric layer, a semiconductor material layer, and a second dielectric layer at least on the front surface; bonding the front surface of the device wafer to a carrier wafer; and thinning the device wafer until the first dielectric layer is exposed; wherein the thinning step comprises grinding the back surface of the device wafer, and etching the back surface of the device wafer by using a chemical etching instrument, and wherein a scanning speed of a spray nozzle of the chemical etching instrument is higher at a central portion of the device wafer than at a peripheral portion of the device wafer.

In some embodiments, a method of fabricating a semiconductor structure comprises the steps of providing a device wafer having a front surface and a back surface, the device wafer comprising a first dielectric layer, a semiconductor material layer, and a second dielectric layer at least on the front surface; providing a carrier wafer having a bonding material layer formed thereon; bonding the second dielectric layer of the device wafer to the bonding material layer of the carrier wafer; and thinning the device wafer; wherein the thinning step comprises grinding the back surface of the device wafer to a first predetermined thickness, and etching the back surface of the device wafer to a second predetermined thickness by using a chemical etching instrument, and wherein a scanning speed of a spray nozzle of the chemical etching instrument is higher at a central portion of the device wafer than at a peripheral portion of the device wafer.

In some embodiments, a semiconductor structure comprises a wafer; a bond oxide layer disposed over the wafer; a semiconductor material layer comprising features disposed over the bond oxide layer, the features comprising a back end of line (BEOL) portion disposed on the first dielectric layer and a middle end of line (MEOL) portion on the back end of line portion; and a dielectric layer disposed over the semiconductor material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising the steps of:
   providing a device wafer having a front surface and a back surface, the device wafer comprising a first dielectric layer, a semiconductor material layer, and a second dielectric layer at least on the front surface;
   bonding the front surface of the device wafer to a carrier wafer thereby forming a gap between a peripheral portion of the bonded wafers;
   filling the gap with a protection material by a jet nozzle; and
   thinning the device wafer until the first dielectric layer is exposed;
   wherein the thinning step comprises grinding the back surface of the device wafer, and etching the back surface of the device wafer by using a chemical etching instrument,
   wherein a scanning speed of a spray nozzle of the chemical etching instrument is higher at a central portion of the device wafer than at a peripheral portion of the device wafer,
   wherein the scanning speed of the spray nozzle is constant at the central portion of the device wafer, and the scanning speed of the spray nozzle decreases from the central portion to the peripheral portion of the device wafer,
   wherein the thinning step comprises grinding the back surface of the device wafer to a first predetermined thickness, etching the back surface of the device wafer by using a first etching aqueous solution to a second predetermined thickness, and etching the back surface of the device wafer by using a second etching aqueous solution so that the device wafer is completed removed,
   wherein a flow rate of the first etching aqueous solution ranges from about 3 L/min to about 5 L/min, and
   wherein the scanning speed of the spray nozzle at a central portion of the device wafer is about 70 mm/s.

2. The method of claim 1, wherein the carrier wafer comprises a bonding material layer formed thereon.

3. The method of claim 2, wherein the bonding step comprises bonding the second dielectric layer of the device wafer to the bonding material layer of the carrier wafer.

4. The method of claim 1, wherein the first predetermined thickness is larger than the second predetermined thickness.

5. The method of claim 4, wherein the first predetermined thickness ranges from about 15 µm to about 20 µm, and the second predetermined thickness ranges from about 0.1 µm to about 5 µm.

6. The method of claim 1, wherein the first etching aqueous solution comprises hydrofluoric acid, nitric acid, sulfuric acid, phosphorous acid, or mixtures thereof, and the second etching aqueous solution comprises tetramethylammonium hydroxide (TMAH), ammonium hydroxide, or mixtures thereof.

7. The method of claim 1, wherein the device wafer comprises features in the semiconductor material layer, and the features comprise a front end of line (FEOL) portion on the first dielectric layer, a middle end of line (MEOL) portion on the front end of line portion, and a back end of line (BEOL) portion on the middle end of line portion.

8. A method of fabricating a semiconductor structure, comprising the steps of:
   providing a device wafer having a front surface and a back surface, the device wafer comprising a first dielectric layer, a semiconductor material layer, and a second dielectric layer at least on the front surface;
   bonding the front surface of the device wafer to a carrier wafer thereby forming a gap between a peripheral portion of the bonded wafers;
   filling the gap with a protection material by a jet nozzle; and
   thinning the device wafer until the first dielectric layer is exposed;
   wherein the thinning step comprises grinding the back surface of the device wafer, and etching the back surface of the device wafer by using a chemical etching instrument,
   wherein a scanning speed of a spray nozzle of the chemical etching instrument is higher at a central portion of the device wafer than at a peripheral portion of the device wafer,
   wherein the scanning speed of the spray nozzle is constant at the central portion of the device wafer, and the scanning speed of the spray nozzle decreases from the central portion to the peripheral portion of the device wafer,
   wherein the scanning speeds decreases with a slope pattern comprising a first slope, a second slope and a third slope from the central portion to the peripheral portion of the device wafer, and wherein the second slope is higher than the third slope, and the third slope is higher than the first slope, and
   wherein the scanning speed of the spray nozzle of the chemical etching instrument decreases from about 70 mm/s to about 50 mm/s to about 20 mm/s to 0 mm/s.

9. The method of claim 8, wherein the carrier wafer comprises a bonding material layer formed thereon.

10. The method of claim 9, wherein the bonding step comprises bonding the second dielectric layer of the device wafer to the bonding material layer of the carrier wafer.

11. The method of claim 8, wherein the first predetermined thickness is larger than the second predetermined thickness.

12. The method of claim 11, wherein the first predetermined thickness ranges from about 15 µm to about 20 µm, and the second predetermined thickness ranges from about 0.1 µm to about 5 µm.

13. The method of claim 8, wherein the first etching aqueous solution comprises hydrofluoric acid, nitric acid, sulfuric acid, phosphorous acid, or mixtures thereof, and the second etching aqueous solution comprises tetramethylammonium hydroxide (TMAH), ammonium hydroxide, or mixtures thereof.

14. A method of fabricating a semiconductor structure, comprising the steps of:
   providing a device wafer having a front surface and a back surface, the device wafer comprising a first dielectric layer, a semiconductor material layer, and a second dielectric layer at least on the front surface;

bonding the front surface of the device wafer to a carrier wafer thereby forming a gap between a peripheral portion of the bonded wafers;

filling the gap with a protection material by a jet nozzle; and thinning the device wafer until the first dielectric layer is exposed;

wherein the thinning step comprises grinding the back surface of the device wafer, and etching the back surface of the device wafer by using a chemical etching instrument, wherein a scanning speed of a spray nozzle of the chemical etching instrument is higher at a central portion of the device wafer than at a peripheral portion of the device wafer, wherein the scanning speed of the spray nozzle is constant at the central portion of the device wafer, and the scanning speed of the spray nozzle decreases from the central portion to the peripheral portion of the device wafer, and wherein the scanning speed of the spray nozzle at a central portion of the device wafer is about 70 mm/s.

15. The method of claim 14, wherein the scanning speeds decreases with a slope pattern comprising a first slope, a second slope and a third slope from the central portion to the peripheral portion of the device wafer, and wherein the second slope is higher than the third slope, and the third slope is higher than the first slope.

16. The method of claim 14, wherein the scanning speed of the spray nozzle of the chemical etching instrument decreases from about 70 mm/s to about 50 mm/s to about 20 mm/s to 0 mm/s.

17. The method of claim 14, wherein the carrier wafer comprises a bonding material layer formed thereon.

18. The method of claim 17, wherein the bonding step comprises bonding the second dielectric layer of the device wafer to the bonding material layer of the carrier wafer.

19. The method of claim 14, wherein the thinning step comprises grinding the back surface of the device wafer to a first predetermined thickness, etching the back surface of the device wafer by using a first etching aqueous solution to a second predetermined thickness, and etching the back surface of the device wafer by using a second etching aqueous solution so that the device wafer is completed removed.

20. The method of claim 19, wherein the first etching aqueous solution comprises hydrofluoric acid, nitric acid, sulfuric acid, phosphorous acid, or mixtures thereof, and the second etching aqueous solution comprises tetramethylammonium hydroxide (TMAH), ammonium hydroxide, or mixtures thereof.

* * * * *